US011127870B2

United States Patent
Deng et al.

(10) Patent No.: US 11,127,870 B2
(45) Date of Patent: Sep. 21, 2021

(54) WEAR-RESISTANT SELF-CLEANING SOLAR CELL PANEL HAVING INVERTED MICROSTRUCTURE FILLED WITH SUPERHYDROPHOBIC NANOMATERIAL

(71) Applicant: University of Electronic Science and Technology of China, Chengdu (CN)

(72) Inventors: Xu Deng, Chengdu (CN); Dehui Wang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 17/075,720

(22) Filed: Oct. 21, 2020

(65) Prior Publication Data
US 2021/0193856 A1    Jun. 24, 2021

(30) Foreign Application Priority Data

Dec. 18, 2019    (CN) .......................... 201911310493.8

(51) Int. Cl.
*G02B 1/18* (2015.01)
*H01L 31/048* (2014.01)
(Continued)

(52) U.S. Cl.
CPC ............ *H01L 31/0481* (2013.01); *G02B 1/18* (2015.01); *H02S 40/10* (2014.12); *B29C 59/022* (2013.01);
(Continued)

(58) Field of Classification Search
CPC ............ B29C 59/022; B29C 2059/023; B29K 2995/0093; B29L 2031/34; G02B 1/18;
(Continued)

(56) References Cited

U.S. PATENT DOCUMENTS

2012/0138769 A1    6/2012    Dang et al.
2018/0213659 A1*   7/2018    Wu .......................... H05K 5/02

FOREIGN PATENT DOCUMENTS

CN    104583812 A    4/2015
CN    104910776 A    9/2015

OTHER PUBLICATIONS

Kun Huang et al., Preparation of Sprayable Transparent Superamphiphoic Coating Based on Silicone Rubber, Rubber Technology, 2019, pp. 376-382, vol. 17.

* cited by examiner

*Primary Examiner* — Ryan S Dunning
(74) *Attorney, Agent, or Firm* — Bayramoglu Law Offices LLC

(57) ABSTRACT

A wear-resistant self-cleaning solar cell panel includes a transparent substrate. A plurality of continuous microstructures are arranged on the transparent substrate, and each microstructure is an inverted pyramid or an inverted conical hole, and the microstructure is filled with a plurality of superhydrophobic nanomaterials, the microstructures and the superhydrophobic nanomaterials jointly constitute a composite surface of the solar cell panel. An angle of a side wall of the inverted pyramid or the inverted conical hole is α, wherein 30°<α<90°. A side length of the microstructure is a, wherein 1 μm<a<2 mm. A spacing between adjacent microstructures is b, wherein 10 nm<b<2 mm. The superhydrophobic nanomaterials are filled into the microstructure by an in-situ deposition method or an indirect filling method.

8 Claims, 8 Drawing Sheets

(51) Int. Cl.
*H02S 40/10* (2014.01)
*B29C 59/02* (2006.01)
*B29L 31/34* (2006.01)

(52) U.S. Cl.
CPC .................. *B29C 2059/023* (2013.01); *B29K 2995/0093* (2013.01); *B29L 2031/34* (2013.01)

(58) Field of Classification Search
CPC .. G02B 27/0006; H01L 31/0481; H02S 40/10
See application file for complete search history.

WEAR-RESISTANT SELF-CLEANING SOLAR CELL PANEL HAVING INVERTED MICROSTRUCTURE FILLED WITH SUPERHYDROPHOBIC NANOMATERIAL

CROSS REFERENCE TO THE RELATED APPLICATIONS

This application is based upon and claims priority to Chinese Patent Application No. 201911310493.8, filed on Dec. 18, 2019, the entire contents of which are incorporated herein by reference.

TECHNICAL FIELD

The present invention relates to the technical field of solar cell panels, and in particular to a wear-resistant self-cleaning solar cell panel.

BACKGROUND

In the photovoltaic power generation industry, since the panels installed outdoors are susceptible to dust and dirt, the accumulation of the dust and dirt reduces a transmission rate of sunlight, thus greatly reducing energy conversion efficiency. Although new high-efficiency solar cells have been developed in recent years, efficiency loss caused by dust deposited on panels is ever present. Generally speaking, average power generation efficiency will be reduced by 10%-25% per month due to the dust deposited on battery panels; in some regions where haze frequently occurs, such as China, India, Arabian Peninsula, etc., monthly power generation efficiency can be reduced by up to 50%. Even in California, where the air quality condition is good, the power generation efficiency is reduced by 7.4% after 145 days. A lot of manpower, water, and power resources are spent on cleaning the dusty battery panel.

Recently, people tried to use superhydrophobic surfaces with lotus self-cleaning effect to remove dust, thereby maintaining a high light transmittance of the solar cell panel. The surface of the superhydrophobic material generally has characteristics having a contact angle of water of 150° or more and a roll-off angle of water of 10° or less. Superhydrophobicity typically depends on the low surface energy and the roughness provided by a micro or nanostructure. However, the micro or nanostructure (especially the nano-structure) of the superhydrophobic surface has dissatisfactory mechanical stability on the macroscale, so it is prone to damages caused by friction in the process of installation and transportation, as well as the impact of high-speed water droplets (streams) such as rainstorm in use. In addition, the micro or nanostructure that provides roughness often causes light scattering that reduces the light transmittance. Therefore, an ordinary superhydrophobic surface cannot ensure both high light transmittance and good mechanical stability at the same time as the ordinary superhydrophobic surface has poor wear resistance and scratch resistance. On the premise of ensuring excellent superhydrophobic (self-cleaning) performance, how to maintain mechanical stability and high transmittance has become a technical problem in the development of self-cleaning solar cell panels, which restricts the application of the self-cleaning solar cell panels in the photovoltaic field.

SUMMARY

In view of the above problems existing in the prior art, the present invention provides a wear-resistant self-cleaning solar cell panel, including a composite surface composed of microstructures and superhydrophobic nanomaterials. A nanostructure can withstand an impact or external friction under the protection of microstructure while maintaining a self-cleaning function and high transmittance, which effectively solves problems of how to assure the wear-resistant self-cleaning solar cell panel of superhydrophobicity, high transmittance, and mechanical stability at the same time.

In order to achieve the above objective, the technical solution adopted by the present invention is as follows. A wear-resistant self-cleaning solar cell panel includes a transparent substrate. A plurality of continuous microstructures are arranged on the transparent substrate, and each microstructure is an inverted pyramid or an inverted conical hole, and the microstructure is filled with a plurality of superhydrophobic nanomaterials, the microstructure and the superhydrophobic nanomaterials jointly constitute a composite surface of the solar cell panel.

Further, an angle of a side wall of the inverted pyramid or the inverted conical hole relative to the horizontal plane is $\alpha$, and the angle is $30°<\alpha<90°$.

Further, a side length of the microstructure is $1\ \mu m<a<2$ mm, and a spacing between adjacent microstructures is $10\ nm<b<2$ mm.

Further, the superhydrophobic nanomaterials are filled into the microstructure by an in-situ deposition method or an indirect filling method.

Further, materials of the transparent substrate are glass, quartz, diamond, polymethyl methacrylate, polyethylene terephthalate, polycarbonate, polydimethylsiloxane, polyimide, polyethylene or polypropylene.

Further, the superhydrophobic nanomaterials are nano silica, nano zinc oxide, nano copper oxide, nano copper hydroxide, nano cobalt hydroxide or nano titanium dioxide by hydrophobic modification.

Further, the superhydrophobic nanomaterials are Ultra-Ever Dry, NeverWet or Glaco Soft99.

Further, the microstructure is prepared by an embossing method.

Further, the embossing method is micro-contact pressing, UV pressing, hot pressing, heat curing pressing, or roller type pressing.

Mold preparation: using a micro cutting technology based on an ultra-precision machine tool, a photolithography technology and a replica molding method to process a microstructure array opposite to desired microstructures on a surface of a mold preform.

The micro cutting technology for processing a mold: using a diamond tool to cut a surface of a substrate along a fixed direction, keeping a cutting depth unchanged to produce a micro groove; obtaining a parallel micro groove array by periodically repeated cutting; then rotating a cutting direction to a fixed angle, and repeatedly performing a cutting operation under the same condition to obtain the microstructure array on the surface of the mold preform. A material of the mold is one selected from the group consisting of nickel, nickel phosphorus alloy, copper, chromium, quartz, sapphire.

The photolithography and wet etching technology for processing a mold: preparing a pre-designed pattern on a surface of a silicon plate with an oxide layer by a traditional photolithography technology. Etching a silicon dioxide layer by a buffered oxide etch (BOE; HF: 40% $NH_4F=1:6$) solution, and then immersing in 25% tetramethylammonium hydroxide (TMAH) solution to etch at 50-90° C. to prepare the microstructure. One material of the mold is silicon, and a microstructured silicon plate can be used directly as the mold.

The replica molding method for processing a mold: using a surface of the microstructure prepared by the micro cutting or photolithography technology as the mold, and transferring the microstructure to a surface of a polymer material by multiple replica as a template. A material of the mold is one selected from the group consisting of polyimide (PI), polytetrafluoroethylene (PTFE), polydimethylsiloxane (PDMS).

In summary, the present invention has the following advantages.

1. Greatly improves the mechanical stability of the surface of the self-cleaning solar cell panel through the composite surface formed by the microstructures and the superhydrophobic nanomaterials, and the mechanical stability includes excellent wear resistance, scratch resistance and high-speed water impact resistance, so as to prevent a self-cleaning performance of the composite surface from reduction even disappearance due to external friction and wear. Moreover, a nanometer scale of nanomaterials ensures a high light transmittance, which effectively solves the problems of the compatibility of superhydrophobicity, high light transmittance and mechanical stability of a solar cell panel surface.

2. Superhydrophobic nanomaterials are filled on the transparent substrate with the inverted pyramid or inverted conical pore structure by the in-situ deposition method or indirect filling method. Due to the protection of microstructure in the transparent substrate, the superhydrophobic surface cannot be damaged by external friction and impact, so that the superhydrophobic surface can still maintain an excellent self-cleaning effect after extremely severe friction and wear. Besides, a small size (50-100 nm) and small thickness of nanostructure will not cause the light scattering. In addition, the inverted pyramid or inverted conical hole microstructure can effectively reduce the light reflection, so that the superhydrophobic surface has high light transmittance.

3. The wear-resistant self-cleaning solar cell panel can be directly used for a front cover glass of a solar cell, without bonding and pasting the film. In the practical application, due to the protection of microstructure, the superhydrophobic surface can resist 1) the friction and wear during installation and transportation, and 2) the impact of high-speed water flow of 32.6 m/s; thereby maintaining an effective self-cleaning effect. The microstructures for protecting the nanostructure are arranged in order, which can reduce the reflection of light, and enhance the light transmittance of about 3%.

DETAILED DESCRIPTION OF THE EMBODIMENTS

Embodiment 1

Figure 1:
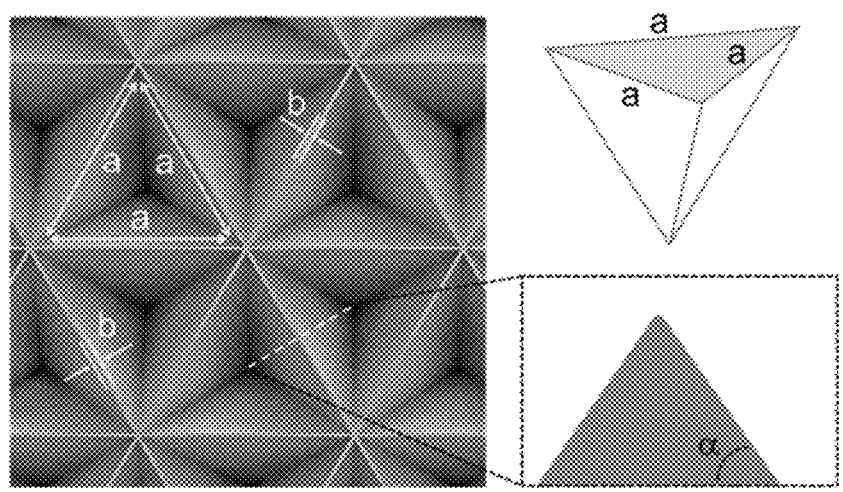
FIG. 1 is a schematic diagram showing a microstructure of an inverted triangular pyramid.
Figure 2:
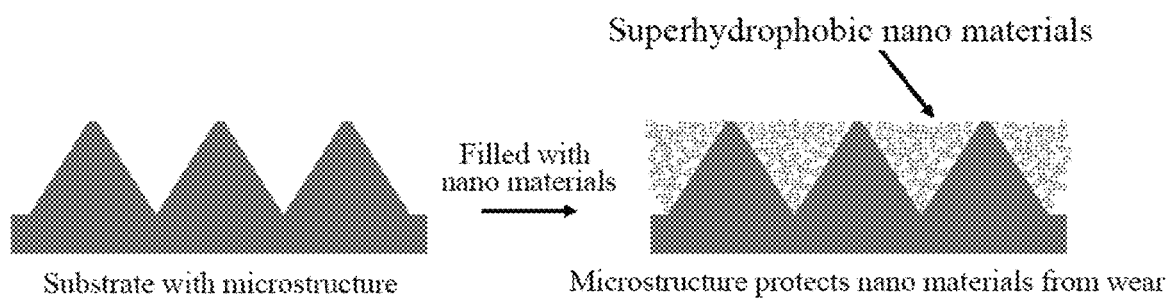
FIG. 2 is a schematic diagram of microstructure filling.

A wear-resistant self-cleaning solar cell panel includes a transparent substrate on which a plurality of continuous microstructures are arranged, and the microstructure is an inverted triangular pyramid. As shown in FIG. 1, an angle of the side wall of the inverted triangular pyramid relative to the horizontal plane is $\alpha$, $30°<\alpha<90°$. A side length of the inverted triangular pyramid is $1\ \mu m<a<2$ mm. A spacing between adjacent inverted triangular pyramids is $10\ nm<b<2$ mm. The microstructure is prepared by a hot embossing method, and the microstructure is filled with a plurality of superhydrophobic nanomaterials by an in-situ deposition method. As shown in FIG. 2, the superhydrophobic nanomaterials form a composite surface.

Figure 3:
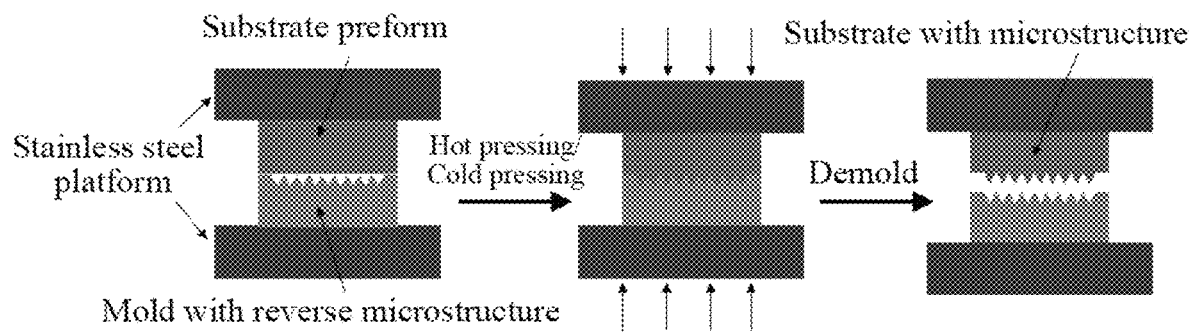
FIG. 3 is a schematic diagram of a hot embossing method/cold embossing method.

Hot embossing method: a preformed substrate is placed on a microstructure mold for hot pressing precision molding, as shown in FIG. 3. The preformed substrate is placed on the mold and heated to 300-1000° C. (depending on a softening temperature of the preformed substrate). Nitrogen is injected to prevent the mold from oxidizing at a high temperature. By compression molding with an external pressure (0.3-10 MPa, depending on a size and proportion of the mold and a preform), the microstructure of a mold surface will be imprinted on a surface of the preformed substrate. Finally, the external pressure is released, a formed preform is cooled to room temperature and demould to obtain a surface with the microstructure. A preformed substrate material is made of glass. A glass plate with an inverted pyramid structure is prepared by the hot embossing method, where, the side wall angle $\alpha=45°$, the side length a=40 um, the spacing b=25 nm.

In situ deposition method: a microstructure substrate deposited with nano ZnO is put into a vapor deposition chamber, and a 10 mL reagent bottle is placed nearby, and 200 ul of perfluorooctyltrichlorosilane is added into the 10 mL reagent bottle. After vacuuming to a vacuum pressure of −0.095 MPa, the vapor deposition chamber is sealed and placed at room temperature for 2 h, and a superhydrophobic transparent cover plate with microstructure protection is obtained. A water static contact angle is 165°. The filling of the nanostructure can fully fill the microstructure, or only cover a surface of the microstructure with a thickness of 1-10 um.

Embodiment 2

Figure 4:
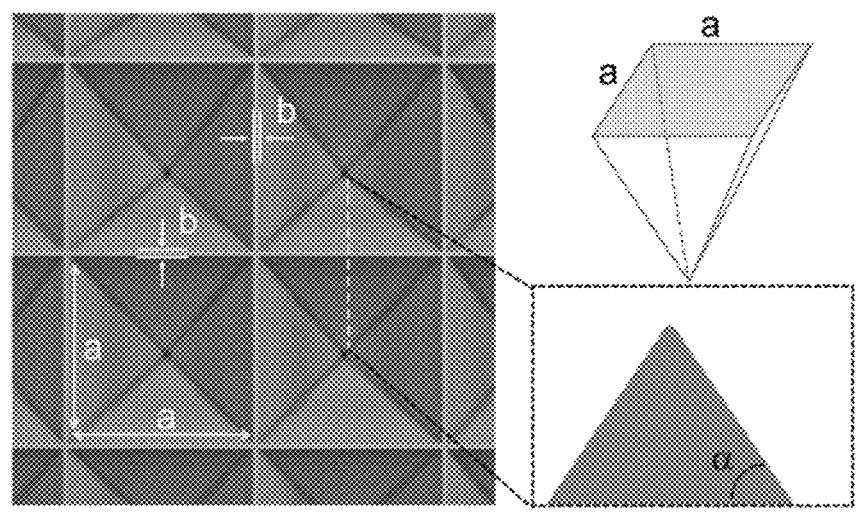
FIG. 4 is a schematic diagram showing a microstructure of an inverted rectangular pyramid.
Figure 5:
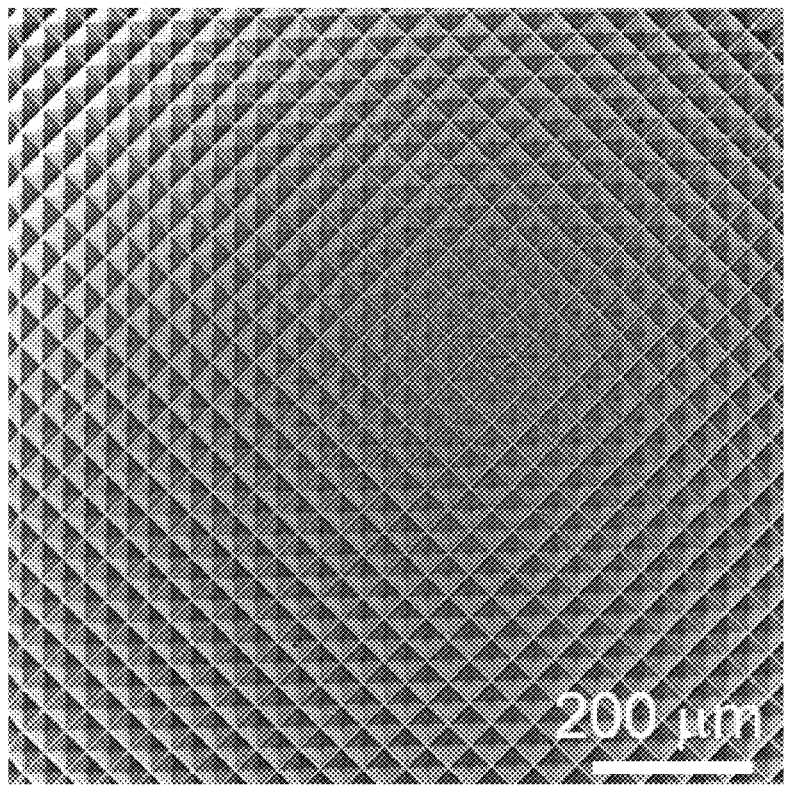
FIG. 5 is a scanning electron microscope (SEM) diagram of the inverted rectangular pyramid.
Figure 6:
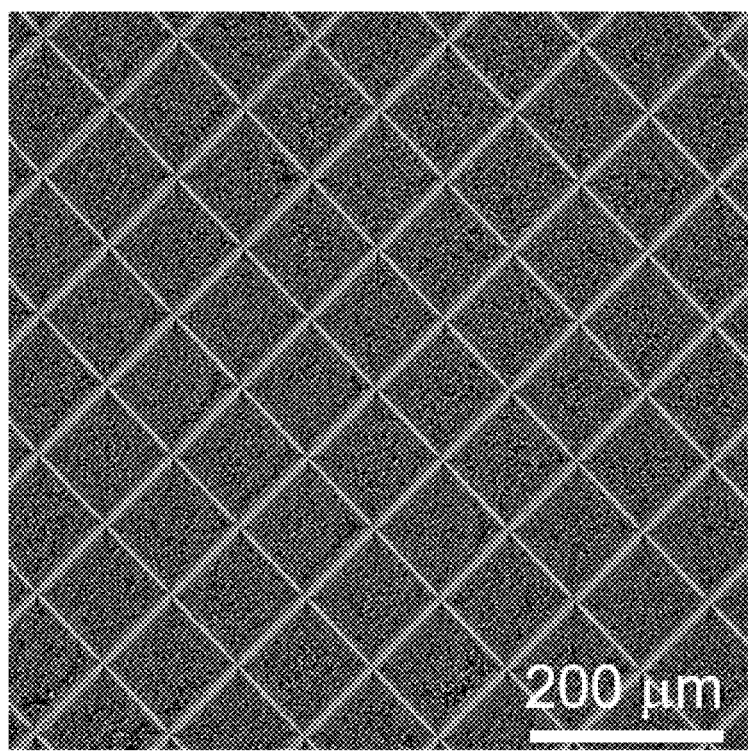
FIG. 6 is a scanning electron microscope (SEM) diagram of the inverted rectangular pyramid after filling.

A wear-resistant self-cleaning solar cell panel includes a transparent substrate on which a plurality of continuous microstructures are arranged, and the microstructure is an inverted pyramid as shown in FIG. 4. A scanning electron microscope (SEM) of the inverted pyramid is shown in FIG. 5. An angle of the side wall of the inverted pyramid is $\alpha$, $30°<\alpha<90°$. A side length of the inverted pyramid is 1 μm$<a<$2 mm. A spacing between adjacent inverted pyramids is 10 nm$<b<$2 mm. The microstructure is prepared by a cold embossing method, and the microstructure is filled with a plurality of superhydrophobic nanomaterials by an indirect filling method. As shown in FIG. 2, the superhydrophobic nanomaterials form a composite surface, and after filling, as shown in FIG. 6.

Cold embossing method: a preformed substrate is placed on a microstructure mold for hot pressing precision molding, as shown in FIG. 3. The preformed substrate is placed on the mold and directly compressed and molded with an external pressure (1-200 MPa, depending on a size of the mold and a proportional preform). The microstructure of a mold surface will be imprinted on a surface of the preformed substrate. Finally, the external pressure is released, a formed preform is demould to obtain a surface with the microstructure. A preformed substrate material is made of polymethyl methacrylate.

Indirect filling method: a spraying method is adopted. During filling, a suspension solution containing nanomaterials is sprayed on a surface of a microstructure substrate with a pressure of 0.1-1 MPa and a spray flow rate of 0.1-10 mL/min, lasting for 5-120 s by a pneumatic sprayer. After drying at room temperature for 10 min, a superhydrophobic transparent cover plate with microstructure protection is obtained. A water static contact angle is 165°.

The nanomaterial of the suspension solution is hydrophobically modified nano silica, and a solvent is acetone. In order to enhance adhesion between nanomaterials and the microstructure substrate, an adhesive is pre-sprayed on the surface of the microstructure before the nanomaterials are indirectly filled in the microstructure by the spraying method, and the adhesive is epoxy resin.

Embodiment 3

Figure 7:
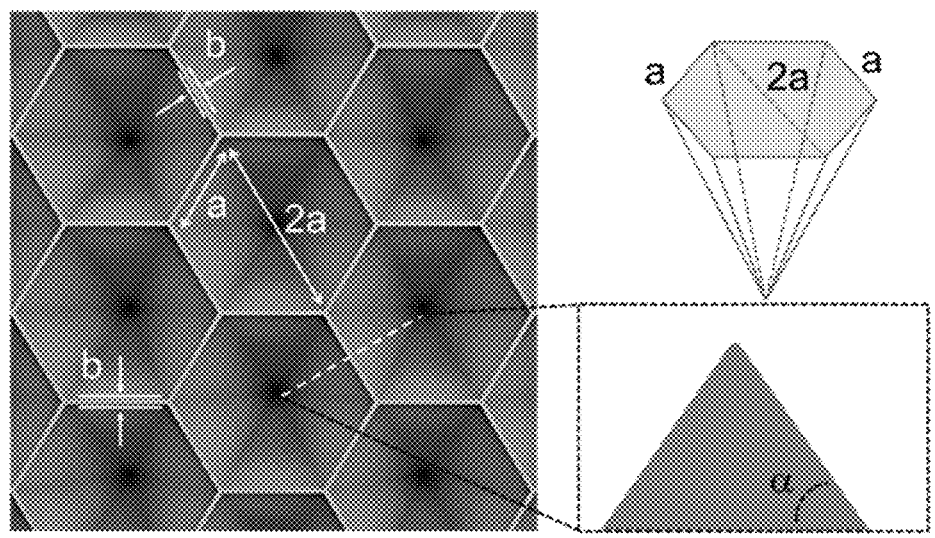
FIG. 7 is a schematic diagram showing a microstructure of an inverted hexagonal pyramid.

A wear-resistant self-cleaning solar cell panel includes a transparent substrate, a plurality of microstructures are continuously arranged on the transparent substrate, and the microstructure is an inverted hexagonal pyramid. As shown in FIG. 7, a side wall angle of the inverted hexagonal pyramid is $\alpha$, $30°<\alpha<90°$, and a side length of the inverted hexagonal pyramid is 1 μm$<a<$2 mm, and a spacing between adjacent inverted hexagonal pyramids is 10 nm$<b<$2 mm. The microstructure is prepared by a roller type embossing method, and the microstructure is filled with a plurality of superhydrophobic nanomaterials by an indirect filling method. As shown in FIG. 2, the superhydrophobic nanomaterials form a composite surface.

Figure 8:
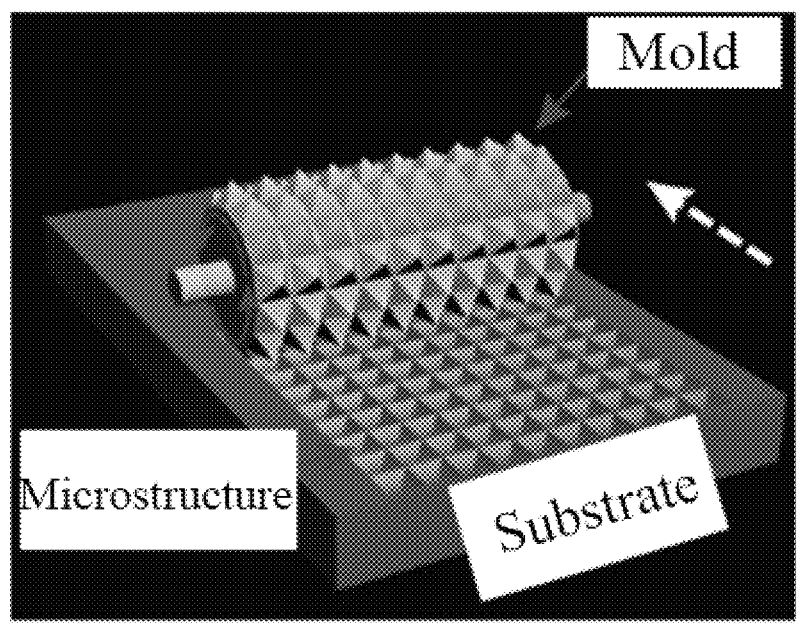
FIG. 8 is a schematic diagram of a roller type embossing method.

Roller type embossing method: a principle of this method is the same as that of the hot/cold embossing method except that a mold is made on a surface of roller, as shown in FIG. 8. This method is suitable for preparation of the large-area transparent panel with the microstructure.

Indirect filling method: a spin coating method is adopted. During filling, 0.1-10 mL suspension solution containing nanomaterials is dripped onto a surface of a microstructure substrate by a spin coater, and a rotation speed of the spin coater is 1000-8000 rpm, lasting for 10-60 s. After drying at room temperature for 10 min, a superhydrophobic transparent cover plate with good transparency and microstructure protection is obtained. A water static contact angle is 165°.

The nanomaterial of the suspension solution is hydrophobically modified nano zinc oxide, and a solvent is ethanol. Before the nanomaterials are indirectly filled into the microstructure by the spin coating method, an adhesive can be pre-coated on the surface of the microstructure to enhance adhesion of the nanomaterials to the microstructure substrate. The adhesive is urea formaldehyde resin.

A thermal stability test, an acid and alkali resistance stability test, a friction and wear test, a high-speed water impact test, and a solar cell power generation efficiency test are carried out on the wear-resistant self-cleaning solar cell panel obtained from embodiments 1-3. The process is as follows.

Thermal stability test: the wear-resistant self-cleaning solar cell panel is heated at a constant temperature, and a static contact angle and a rolling angle are measured after a sample is taken out regularly and cooled to room temperature. The results show that an installation surface remains superhydrophobic when exposed at a temperature close to 100° C. for 30 days. The static contact angle is 160° and the rolling angle is 5°.

Acid and alkali resistance stability test: the sample is immersed in aqua regia (a volume ratio of concentrated hydrochloric acid and concentrated nitric acid is 3:1) and 2.5 mol/L sodium hydroxide solution, respectively, and then is taken out to test its static contact angle and rolling angle directly. After immersion in the acid solution and the alkali solution for 5 h, the wear-resistant self-cleaning solar cell panel still has good superhydrophobicity. The static contact angle is 159°, and the rolling angle is 5.5°.

Friction and wear test: the wear-resistant self-cleaning solar cell panel is scraped and grinded by a stainless steel blade for 100 times under a pressure of 10 N, and still maintain the self-cleaning performance with the static contact angle of 156° and the rolling angle of 6°. The wear-resistant self-cleaning solar cell panel is wiped by a steel wire ball for 100 times under a pressure of 20 N, and still maintain the self-cleaning performance with the static contact angle of 158° and the rolling angle of 5°. The wear-resistant self-cleaning solar cell panel is rubbed by an 800 mesh sandpaper for 100 times under a pressure of 10 N, and still maintain the self-cleaning performance with the static contact angle of 156° and the rolling angle of 7°.

Figure 9:
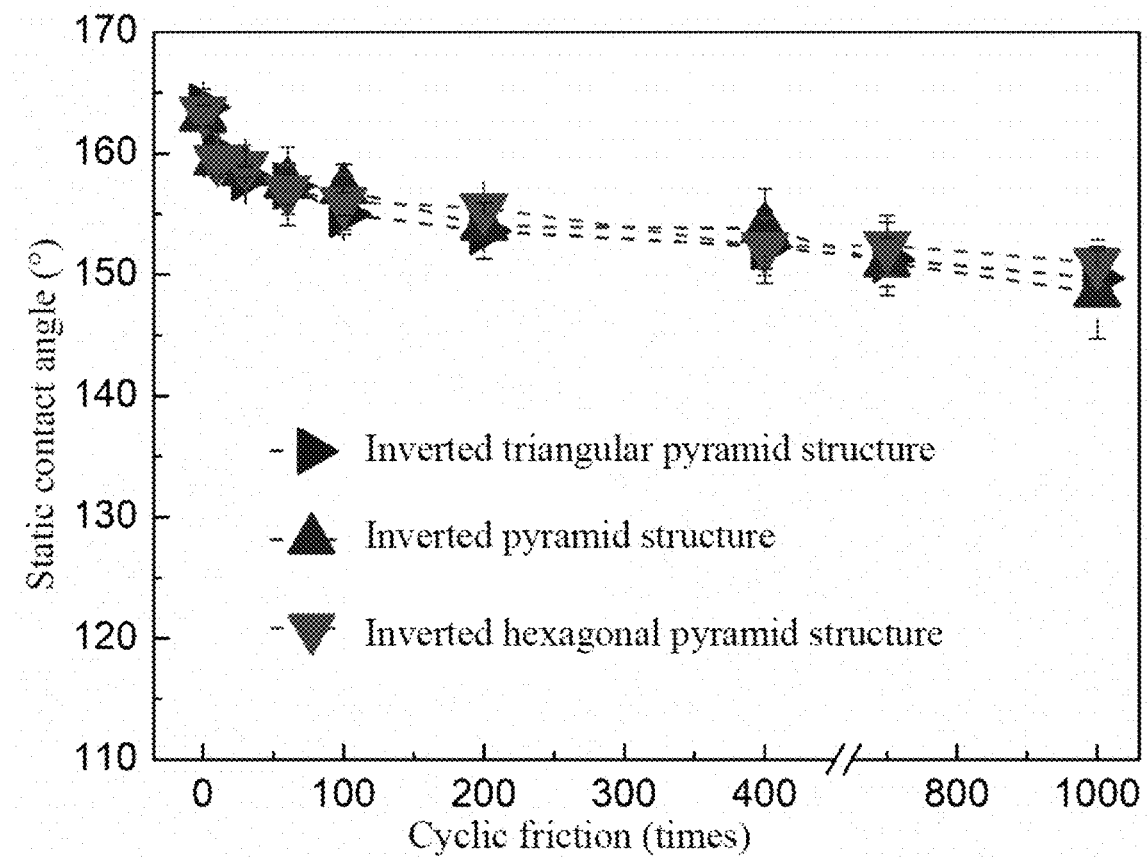
FIG. 9 is a schematic diagram of a static contact angle after cyclic friction.
Figure 10:
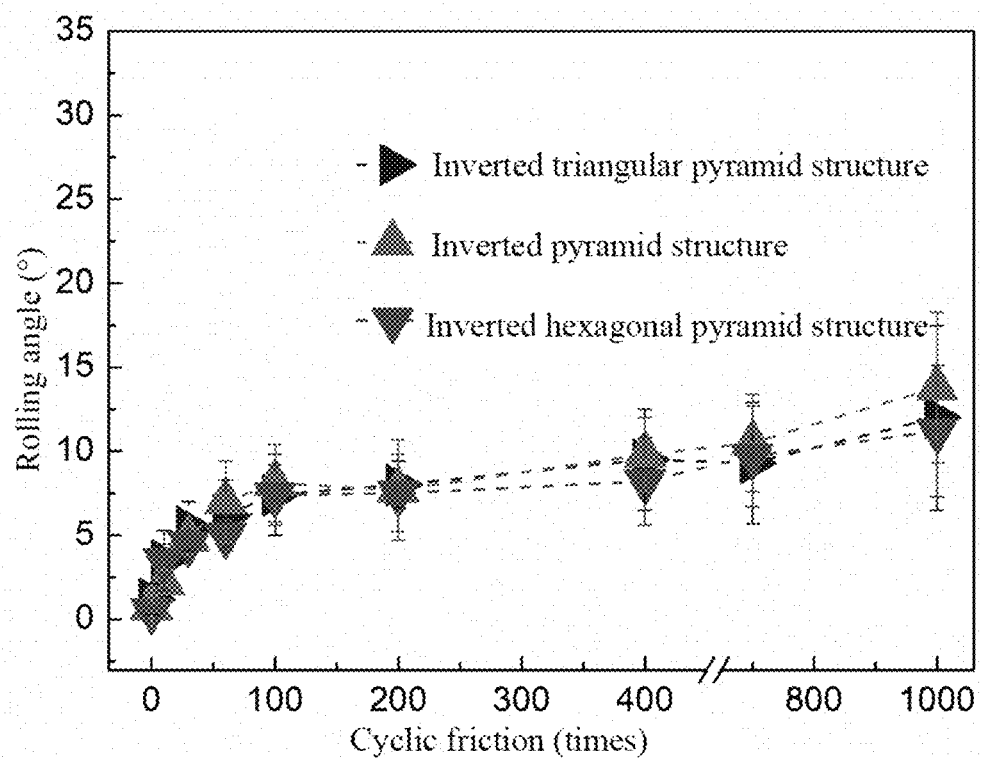
FIG. 10 is a schematic diagram of a rolling angle after cyclic friction.

The static contact angle and the rolling angle of the wear-resistant self-cleaning solar cell panel after a cyclic linear friction test are shown in FIG. 9-10. The cyclic linear friction test is as follows: a test device includes a vertically mounted force sensor, a wear probe (a polypropylene sheet is 5 mm wide and 1 mm thick, and used as the friction probe against the sample surface under a load) and a horizontal sample table. The sensor is fixed on a horizontal moving platform, and the probe moves with the mobile platform, and the sample is subjected to cyclic friction, and the load is about 5 N. The static contact angle and a roll-off angle of wear point are measured by the cyclic friction test. The results show that the mechanical stability of the superhydrophobic surface is significantly improved by using the microstructure to protect the nanostructure, which can withstand the cyclic friction, avoid the friction and wear during installation and transportation to invalidate the self-cleaning performance of the transparent superhydrophobic surface.

Figure 11:
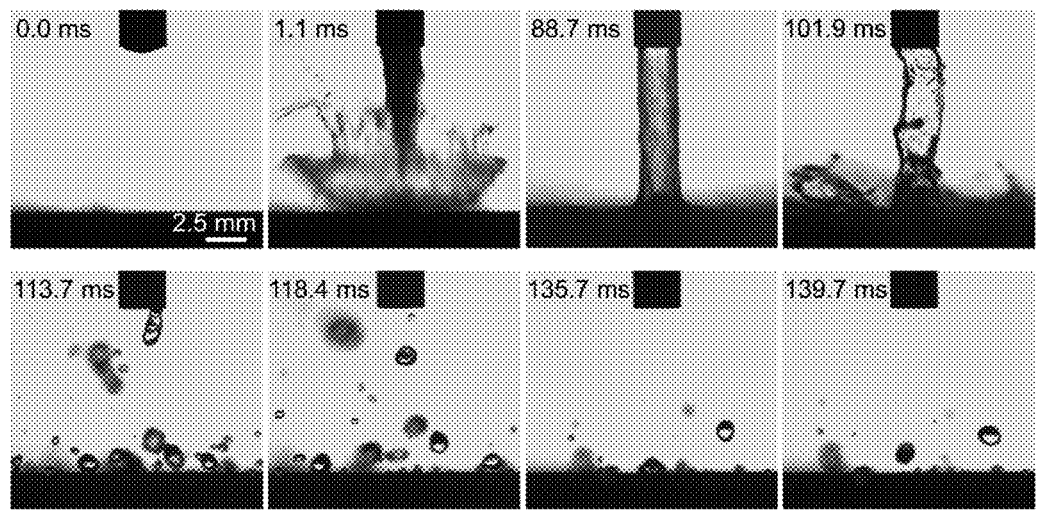
FIG. 11 is a schematic diagram of a high-speed flow impact test.

High-speed water flow impact test: under constant pressure (0.9 MPa), 10 mL water is ejected from a nozzle, an average ejection velocity is 20.4 m/s (a speed of rainstorm raindrop is 9 m/s), a water flow diameter is 2.5 mm, an impact time is 100 ms, and the test is repeated 40 times. The results show that the surface of the wear-resistant self-cleaning solar cell panel shows good resistance to high-speed jet impact. After the surface of the wear-resistant self-cleaning solar is subjected to an impact of water flow at 32.6 m/s for 100 ms (about 16 mL), the static contact angle of the surface is 160° and the rolling angle is 5° as shown in FIG. 11.

Figure 12:
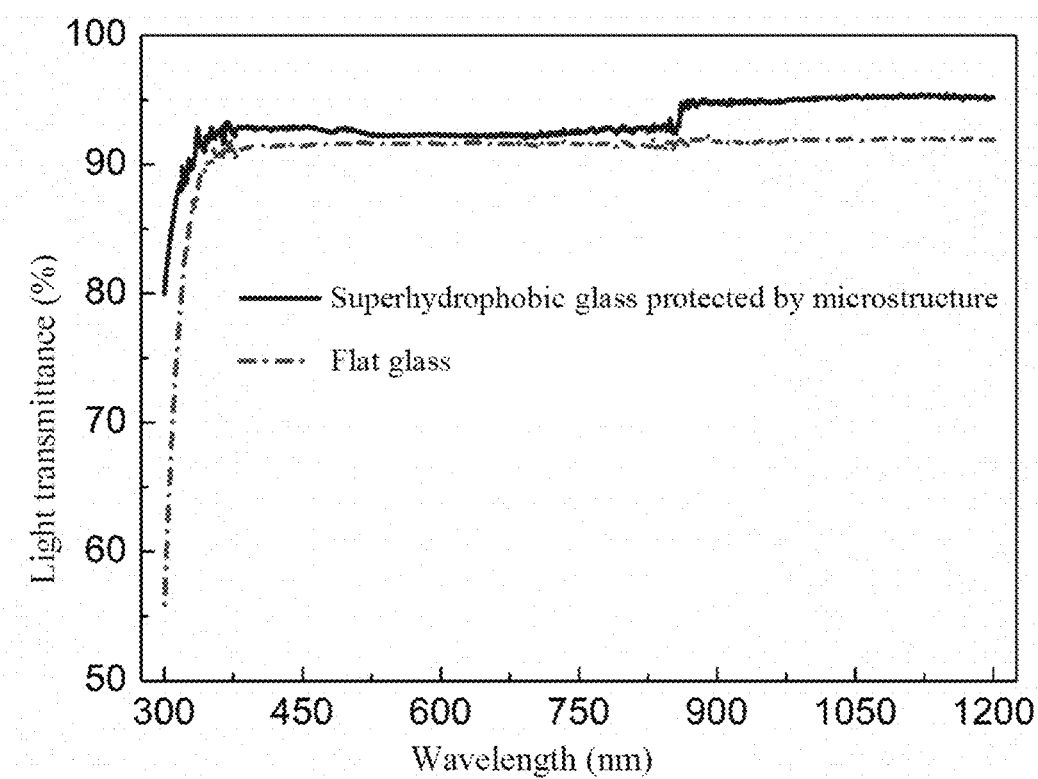
FIG. 12 is a schematic diagram showing light transmittance of superhydrophobic glass.
Figure 13:
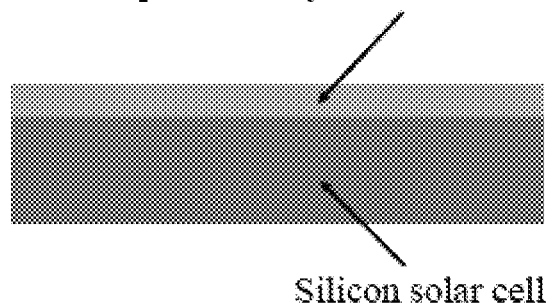
FIG. 13 is a schematic diagram of microstructure protection.
Figure 14:
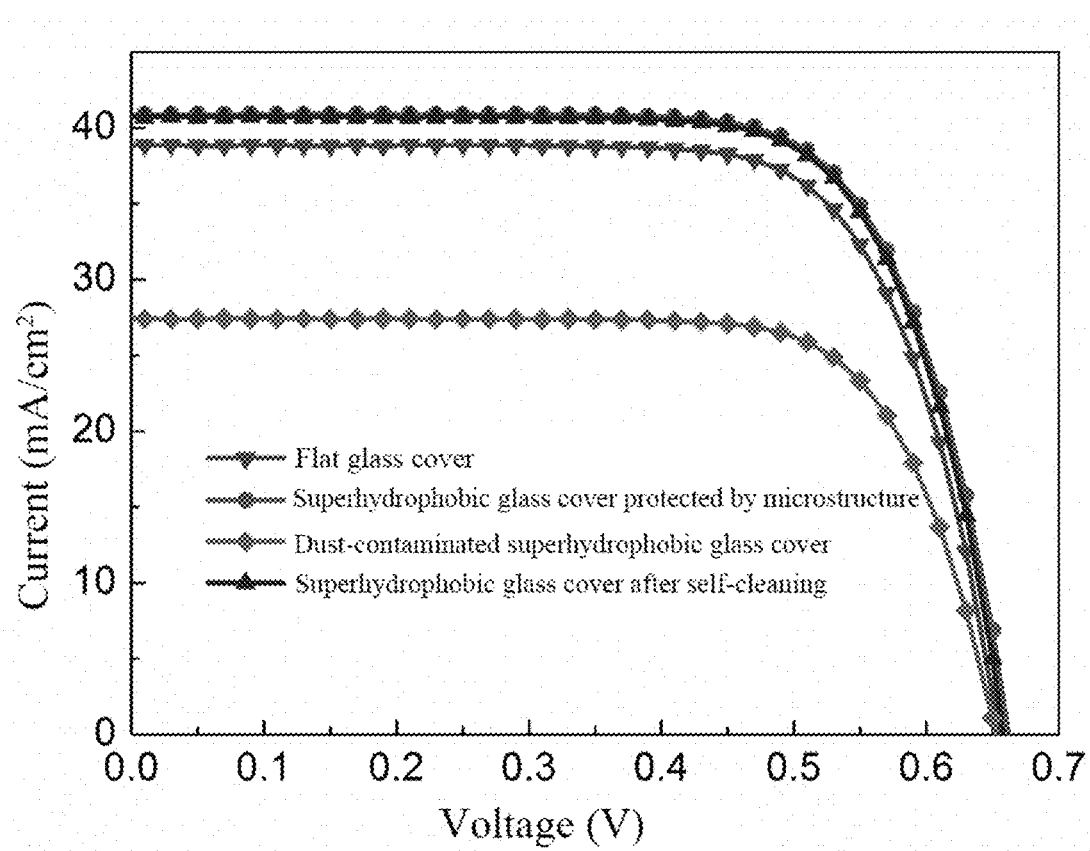
FIG. 14 is a schematic diagram showing an I-V curve of the superhydrophobic glass.
Figure 15:
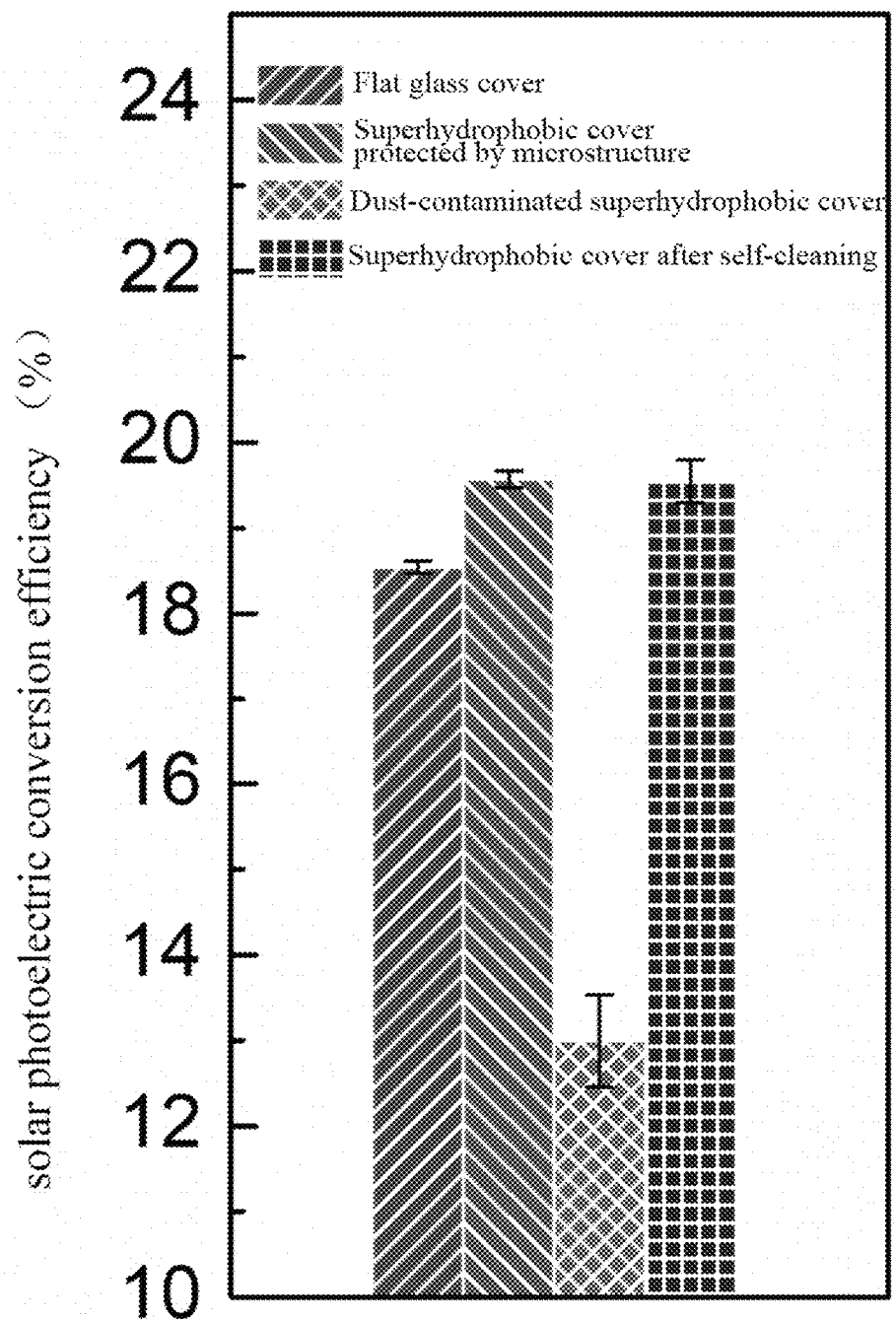
FIG. 15 is a schematic diagram showing test results of solar photovoltaic conversion efficiency.

Solar cell power generation efficiency test: the wear-resistant self-cleaning solar cell panel has good light transmittance, as shown in FIG. 12. The wear-resistant self-cleaning solar cell can be used as a cover plate of a solar cell, and can maintain high energy conversion efficiency of the solar cell, and a schematic diagram is shown in FIG. 13. In the test, a surface of a monocrystalline silicon solar cell is covered with the wear-resistant self-cleaning solar cell panel, and the I-V curve of the monocrystalline silicon solar cell is shown in FIG. 14, and the solar photoelectric conversion efficiency of the monocrystalline silicon solar cell is shown in FIG. 15. In the test, common indoor dust is used to contaminate the superhydrophobic glass cover plate, with a coverage rate of 35%. As a contrast to an ordinary flat glass cover that cannot realize self-cleaning after being contaminated by the dust, the dust on the wear-resistant self-cleaning solar cell panel can be taken away by rain drops or fog condensation water droplets to realize self-cleaning, keep the surface free from dust contamination, maintain high transmittance continuously, and maintain high power generation efficiency of the solar cell.

To sum up, the wear-resistant self-cleaning solar cell panel provided by the present invention has good thermal stability, strong acid and alkali resistance, high wear resistance, and high resistance to high-speed jet impact. The dust deposited on the surface of the solar cell panel is taken away by rain drops or fog condensation water droplets, so as to realize self-cleaning and prevent the surface from the dust contamination. Therefore, the high transmittance is continuously maintained.

Although the specific embodiments of the present invention are described in detail in combination with the drawings, it should not be construed as limiting the scope of protection of the present invention. Within the scope described in the claims, various modifications and transformations that can be made by those skilled in the art without creative labor still fall within the scope of protection of the present invention.

What is claimed is:

1. A wear-resistant self-cleaning solar cell panel, comprising a transparent substrate, wherein
   a plurality of microstructures are continuously arranged on the transparent substrate,
   a microstructure of the plurality of microstructures is an inverted pyramid or an inverted conical hole, and the microstructure is filled with a plurality of superhydrophobic nanomaterials, and
   the plurality of microstructures and the plurality of superhydrophobic nanomaterials jointly constitute a composite surface of the wear-resistant self-cleaning solar cell panel.

2. The wear-resistant self-cleaning solar cell panel according to claim 1, wherein an angle between a side wall and a bottom of the inverted pyramid or the inverted conical hole is $\alpha$, wherein $30°<\alpha<90°$.

3. The wear-resistant self-cleaning solar cell panel according to claim 1, wherein the microstructure is an inverted pyramid, and a side length of the inverted pyramid is a, wherein 1 μm<a<2 mm, and a spacing between adjacent microstructures is b, wherein 10 nm<b<2 mm.

4. The wear-resistant self-cleaning solar cell panel according to claim 1, wherein the plurality of superhydrophobic nanomaterials are filled into the microstructure by an in-situ deposition method or an indirect filling method.

5. The wear-resistant self-cleaning solar cell panel according to claim 1, wherein materials of the transparent substrate are at least one selected from the group consisting of glass, quartz, diamond, polymethyl methacrylate, polyethylene terephthalate, polycarbonate, polydimethylsiloxane, polyimide, polyethylene or polypropylene.

6. The wear-resistant self-cleaning solar cell panel according to claim 1, wherein the superhydrophobic nanomaterials are at least one selected from the group consisting of nano silica, nano zinc oxide, nano copper oxide, nano copper hydroxide, nano cobalt hydroxide or nano titanium dioxide; and the nano silica, the nano zinc oxide, the nano copper oxide, the nano copper hydroxide, the nano cobalt hydroxide and the nano titanium dioxide are treated by hydrophobic modification.

7. The wear-resistant self-cleaning solar cell panel according to claim 1, wherein the microstructure is prepared by an embossing method.

8. The wear-resistant self-cleaning solar cell panel according to claim 7, wherein the embossing method comprises at least one of micro-contact pressing, UV pressing, hot pressing, heat curing pressing and roller type pressing.

* * * * *